(12) United States Patent
Yan et al.

(10) Patent No.: US 10,680,178 B2
(45) Date of Patent: Jun. 9, 2020

(54) ORGANIC SEMICONDUCTOR FORMULATION AND APPLICATION THEREOF

(71) Applicants: He Yan, Hong Kong (CN); The Hong Kong University of Science and Technology, Hong Kong (CN)

(72) Inventors: He Yan, Hong Kong (CN); Jingbo Zhao, Hong Kong (CN)

(73) Assignees: He Yan, Hong Kong (CN); THE HONG KONG UNIVERSITY OF SCIENCE AND TECHNOLOGY, Hong Kong (CN)

(*) Notice: Subject to any disclaimer, the term of this patent is extended or adjusted under 35 U.S.C. 154(b) by 61 days.

(21) Appl. No.: 16/066,165

(22) PCT Filed: Jan. 20, 2017

(86) PCT No.: PCT/US2017/014235
§ 371 (c)(1),
(2) Date: Jun. 26, 2018

(87) PCT Pub. No.: WO2017/127613
PCT Pub. Date: Jul. 27, 2017

(65) Prior Publication Data
US 2019/0013474 A1 Jan. 10, 2019

Related U.S. Application Data

(60) Provisional application No. 62/388,183, filed on Jan. 20, 2016.

(51) Int. Cl.
*H01B 1/12* (2006.01)
*H01L 51/00* (2006.01)
(Continued)

(52) U.S. Cl.
CPC ........ *H01L 51/0036* (2013.01); *C08G 61/123* (2013.01); *C08G 61/126* (2013.01);
(Continued)

(58) Field of Classification Search
CPC ... C08K 3/045; C08L 65/00; C08G 2261/124; C08G 2261/1412; C08G 2261/146;
(Continued)

(56) References Cited

U.S. PATENT DOCUMENTS 8,008,424 B2 * 8/2011 Gaudiana ............. C08G 61/123
 136/252
9,831,433 B2 * 11/2017 Yan ....................... C07D 417/14
(Continued)

FOREIGN PATENT DOCUMENTS

CN 102574991 A 7/2012
CN 103030790 A 4/2013
WO WO2015/096886 A1 7/2015

*Primary Examiner* — Mark Kopec
*Assistant Examiner* — Jaison P Thomas
(74) *Attorney, Agent, or Firm* — WPAT, PC

(57) ABSTRACT

Organic semiconductor formulations are disclosed. One of the formulations comprises a single or mixture of non-halogenated, hydrocarbon solvent, a conjugated polymer donor and a fullerene or small molecular acceptor, wherein the conjugated polymer contains branched alkyl chains with 21 or more carbon atoms. In addition, organic semiconductor film forming methods and applications using of the above-mentioned formulations are disclosed.

3 Claims, 4 Drawing Sheets

PffBT4T-C$_8$C$_{12}$

PffBT4T-C$_{10}$C$_{14}$

(51) Int. Cl.
*C08G 61/12* (2006.01)
*C08K 3/04* (2006.01)
*H01L 51/05* (2006.01)
*H01L 51/42* (2006.01)

(52) U.S. Cl.
CPC ............... *C08K 3/045* (2017.05); *H01B 1/12* (2013.01); *H01L 51/0007* (2013.01); *H01L 51/0043* (2013.01); *H01L 51/0046* (2013.01); C08G 2261/124 (2013.01); C08G 2261/146 (2013.01); C08G 2261/1412 (2013.01); C08G 2261/18 (2013.01); C08G 2261/3223 (2013.01); C08G 2261/3246 (2013.01); C08G 2261/414 (2013.01); C08G 2261/91 (2013.01); H01L 51/0558 (2013.01); H01L 51/4253 (2013.01); Y02E 10/549 (2013.01)

(58) Field of Classification Search
CPC ........ C08G 2261/18; C08G 2261/3223; C08G 2261/3246; C08G 2261/414; C08G 2261/91; C08G 61/123; C08G 61/126; H01L 51/0007; H01L 51/0036; H01L 51/0043; H01L 51/0046; H01L 51/0558; H01L 51/4253; Y02E 10/549; H01B 1/12
See application file for complete search history.

(56) References Cited

U.S. PATENT DOCUMENTS

| | | | | |
|---|---|---|---|---|
| 10,446,756 | B2* | 10/2019 | Yan | C08G 61/124 |
| 2012/0264906 | A1* | 10/2012 | Marks | B82Y 10/00 |
| | | | | 528/86 |
| 2013/0043434 | A1* | 2/2013 | Tierney | C07D 495/04 |
| | | | | 252/500 |
| 2013/0255780 | A1* | 10/2013 | Iwanaga | H01L 51/0036 |
| | | | | 136/263 |
| 2015/0144847 | A1* | 5/2015 | D'Lavari | C08G 61/126 |
| | | | | 252/511 |
| 2018/0013069 | A1* | 1/2018 | Yan | C07D 417/14 |
| 2018/0079858 | A1* | 3/2018 | He | C08G 61/126 |

* cited by examiner

PffBT4T-C$_8$C$_{12}$

PffBT4T-C$_{10}$C$_{14}$

PffT2-FTAZ-C$_{10}$C$_{14}$

ORGANIC SEMICONDUCTOR FORMULATION AND APPLICATION THEREOF

CROSS REFERENCE TO RELATED APPLICATIONS

This application claims priority to and the benefit of U.S. Provisional Patent Application Ser. No. 62/388,183, filed on Jan. 20, 2016, the disclosure of which is incorporated by reference in its entirety.

TECHNICAL FIELD

The present subject matter relates to novel polymer/fullerene formulations, methods for their preparation and intermediates used therein, the use of such formulations as semiconductors in organic electronic (OE) devices, especially in organic solar cells (OSCs) and organic field-effect transistor (OFET) devices, and to OE and OPV devices made from these formulations.

BACKGROUND

In recent years there has been growing interest in the use of organic semiconductors, including conjugated polymers, for various electronic applications such as organic solar cells.

Organic solar cells (OSC) have attracted much attention due to their potential low cost, high-throughput roll-to-roll production, flexibility and light weight. However, top-performance OSCs are all processed using halogenated solvents, which are environmentally hazardous and would thus require expensive mitigation to contain the hazards. Attempts to process OSCs from non-halogenated solvents lead to inferior performance.

One of the major problems holding back the wide-spread use of OSCs is that all high-efficiency (>10%) devices are currently processed from hazardous halogenated solvents such as chlorobenzene (CB), 1,2-dichlorobenzene and additives such as 1,8-diiodooctane (DIO). These solvents are harmful to people and the environment and current state-of-the-art OSCs are thus not truly environmentally friendly in their production processes. In addition, halogenated solvents do not exist in nature and their production requires relatively costly synthetic steps. Hydrocarbons are better choices of solvents for OSC production, as they are more environmentally friendly and readily available from petroleum. However, several reports have indicated that OSCs processed from non-chlorinated solvents generally result in significantly reduced PCE levels, and that the best OSCs are still processed from halogenated solvents. One reason for the much poorer performance is that state-of-the-art donor and/or acceptor materials for OSCs typically exhibit poor solubility in non-halogenated solvents, which results in a poor bulk-heterojunction (BHJ) morphology containing excessively large domains. On the other hand, controlling and optimizing BHJ morphology is one of the most important challenges for OSCs. Some morphology parameters (e.g., molecular orientation at or relative to the donor/acceptor (D/A) interface, polymer backbone orientation, and domain purity) are quite challenging to control. Therefore, new tools and insights are needed to improve the morphology and performance of OSCs.

One particular area of importance is the field of organic photovoltaics. Organic semiconductors (OSCs) have found use in OPV as they allow devices to be manufactured by solution-processing techniques such as spin casting and printing. Solution processing can be carried out cheaper and on a larger scale compared to the evaporative techniques used to make inorganic thin film devices. State-of-the-art OPV cells consist of a blend film of a conjugated polymer and a fullerene derivative, which function as an electron donor and an electron acceptor, respectively. In order to achieve highly efficient OPVs, it is important to optimize both the polymer (donor) and fullerene (acceptor) components and to find a material combination yielding an optimal bulk heterojunction (BHJ) morphology that supports efficient exciton harvesting and charge transport properties. Recent improvements in the efficiencies of single-junction OPVs (efficiency ~8-9%) have largely been due to the development of low-band-gap polymers, which are defined as polymers with an absorption onset of at least 750 nm or more and with a band-gap of 1.65 eV or less. For example, poly(3-hexylthiophene) (P3HT), a low-performance OPV polymer having a band-gap of ~1.9 eV, is not considered to be a state-of-the-art polymer for OPVs.

The low-band-gap polymer materials and the polymer/fullerene formulations suggested in the prior art for use in OPVs still suffer from certain drawbacks. High-efficiency (>8%) OPVs can be achieved using many different low-band-gap polymers, but all are constrained to use hazardous halogenated solvents in the device processing. Replacing halogenated solvents with hydrocarbon solvents were previously found to decrease the OSC efficiency from 9.2% to 6-7%.

Polymer thieno[3,4-b]thiophene/benzodithiophene (PTB7), described in the prior art, can achieve 9.2% efficiency when halogenated solvents. The structure of PTB7 is

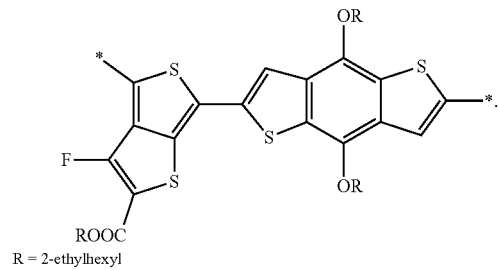

R = 2-ethylhexyl

Using hydrocarbon solvents to process PTB7 resulted in OSC efficiency of about 6-7%.

The aim of the presently claimed subject matter is to provide environmentally friendly non-halogenated solvent-based formulations for organic solar cells without degrading the performance of OSCs.

SUMMARY

In recent years there has been growing interest in the use of organic semiconductors, including conjugated polymers, for various electronic applications such as organic solar cells.

Organic solar cells (OSC) have attracted much attention due to their potential low cost, high-throughput roll-to-roll production, flexibility and light weight. However, top-performance OSCs are all processed using halogenated solvents, which are environmentally hazardous and would thus require expensive mitigation to contain the hazards. Attempts to process OSCs from non-halogenated solvents lead to inferior performance. Overcoming this hurdle, we demonstrate a hydrocarbon-based processing system that is not only more environmentally friendly but also yields OSCs with great performance. Our processing system incorporates the synergistic effects of a hydrocarbon solvent, a novel additive, a suitable choice of polymer side chain, and strong temperature-dependent aggregation of the donor polymer. Our results not only demonstrate a method of producing active layers of OSCs in an environmentally friendly way, but also provide important scientific insights that will facilitate further improvement of the morphology and performance of OSC One of the major problems holding back the wide-spread use of OSCs is that all high-efficiency (>10%) devices are currently processed from hazardous halogenated solvents such as chlorobenzene (CB), 1,2-dichlorobenzene and additives such as 1,8-diiodooctane (DIO). These solvents are harmful to people and the environment and current state-of-the-art OSCs are thus not truly environmentally friendly in their production processes. In addition, halogenated solvents do not exist in nature and their production requires relatively costly synthetic steps. Hydrocarbons are better choices of solvents for OSC production, as they are more environmentally friendly and readily available from petroleum. However, several reports have indicated that OSCs processed from non-chlorinated solvents generally result in significantly reduced PCE levels, and that the best OSCs are still processed from halogenated solvents. One reason for the much poorer performance is that state-of-the-art donor and/or acceptor materials for OSCs typically exhibit poor solubility in non-halogenated solvents, which results in a poor bulk-heterojunction (BHJ) morphology containing excessively large domains.

Here, we demonstrate a hydrocarbon solvent-based processing system that yields high efficiency single-junction OSCs. Our hydrocarbon process combines the synergistic effects of a hydrocarbon solvent named 1,2,4-trimethylbenzene (TMB), a novel additive named 1-phenylnaphethlene (PN), an optimal alkyl chain length and pronounced temperature-dependent aggregation of the donor polymer. This advance is facilitated by a series of polymers that exhibit a strong temperature-dependent aggregation property, which enables excellent solubility of the polymers in hydrocarbon solvents at elevated temperatures (>80° C.). The PN additive plays a critical role, as it simultaneously introduces several beneficial changes to the morphological and photovoltaic properties of the cells. The PN additive drives the polymer backbone orientation relative to the substrate from edge-on to face-on, reduces the domain size, and increases the domain purity of the BHJ films, hence leading to a large enhancement of the PCE from 6.4% to 11.7%. The host solvent, TMB, is also important, as it enables better molecular orientation relative to the polymer:fullerene interfaces than is found in films processed from halogenated solvents. Our studies also provide important insights into the critical influences of a small difference in the polymer alkyl chain length on the blend morphology of OSCs. On the one hand, increasing the length of alkyl chains results in a beneficial change: the polymer backbone orientation gradually turns from edge-on to face-on. On the other hand, longer alkyl chains, especially $C_{10}C_{14}$, are found to be detrimental to the domain size and domain purity. The balancing of these two anti-synergistic effects led to an optimized choice of alkyl chain ($C_9C_{13}$) for the TMB-PN system. In comparison, the optimized alkyl chain length is different for the CB-DIO system. This provides important guidelines for developing high-performance OSCs based on environmentally friendly solvent systems from matched polymers.

BRIEF DESCRIPTION OF THE DRAWINGS

It should be understood that the drawings described above or below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Definitions

Figure 1A:
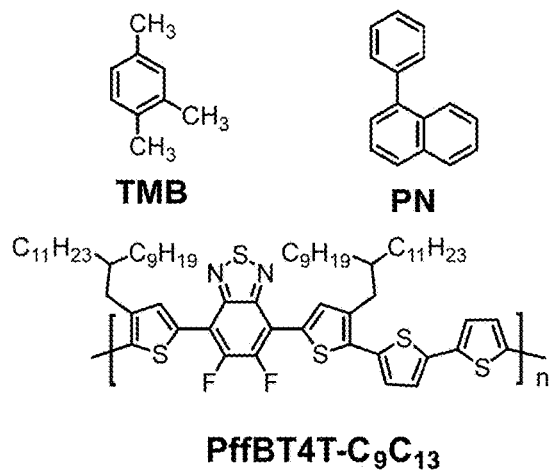
FIG. 1A is the chemical structures of TMB, PN and PffBT4T-$C_9C_{13}$.
Figure 1B:
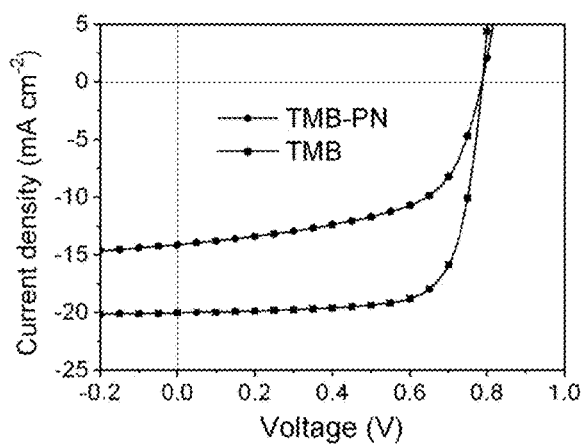
FIG. 1B shows the J-V curves of PffBT4T-$C_9C_{13}$: $PC_{71}BM$-based solar cells processed from TMB or TMB-PN.
Figure 1C:
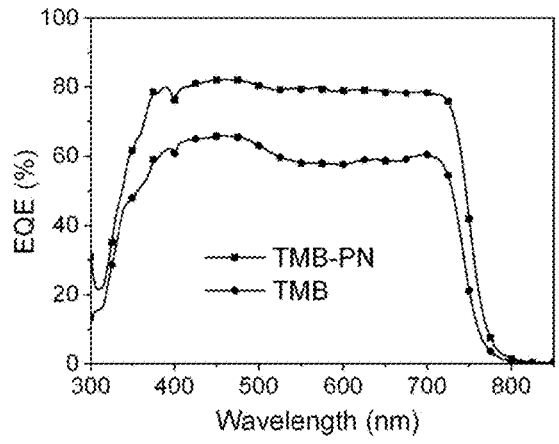
FIG. 1C shows the EQE curves of PffBT4T-$C_9C_{13}$: $PC_{71}BM$-based solar cells processed from TMB or TMB-PN.
Figure 2A:
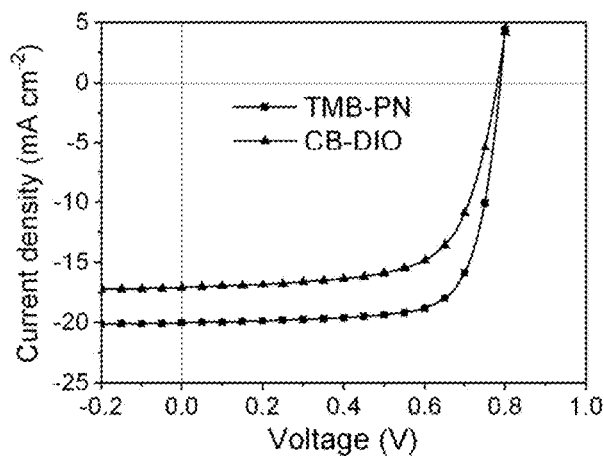
FIG. 2A shows the J-V curves of PffBT4T-$C_9C_{13}$: $PC_{71}BM$-based solar cells processed from CB-DIO or TMB-PN.
Figure 2B:
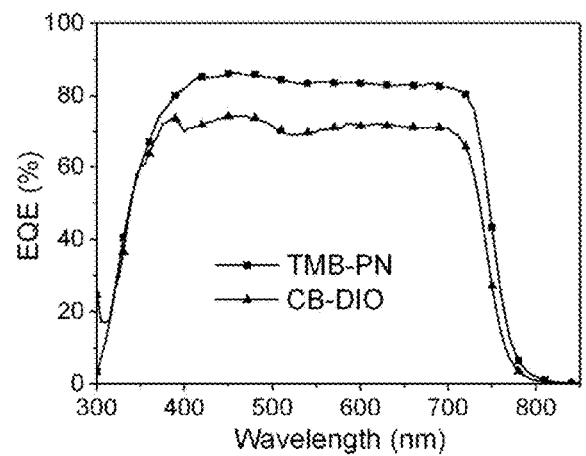
FIG. 2B shows the EQE curves of PffBT4T-$C_9C_{13}$: $PC_{71}BM$-based solar cells processed from CB-DIO or TMB-PN.
Figure 3:
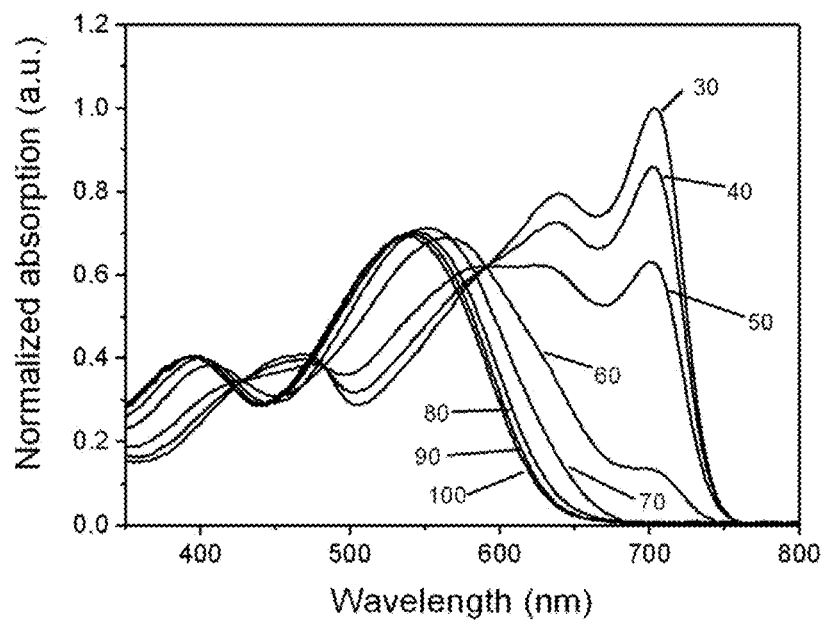
FIG. 3 shows the UV-Vis absorption spectra of PffBT4T-$C_9C_{13}$ at elevated temperatures in a 0.02 mg mL$^{-1}$ TMB solution. The insets indicate temperatures (units: ° C.).
Figure 4A:
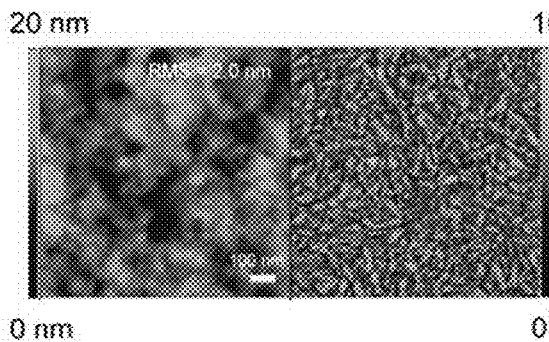
FIG. 4A shows the AFM (1×1 μm) images of PffBT4T-$C_9C_{13}$:$PC_{71}BM$ blend films processed from TMB-PN. The height and phase images are displayed on the left and right sides, respectively.
Figure 4B:
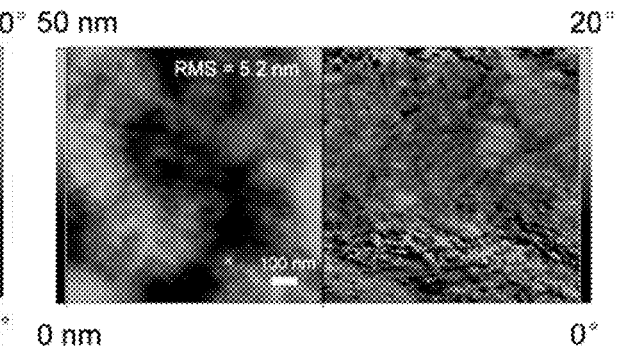
FIG. 4B shows the AFM (1×1 μm) images of PffBT4T-$C_9C_{13}$:$PC_{71}BM$ blend films processed from TMB. The height and phase images are displayed on the left and right sides, respectively.
Figure 5:
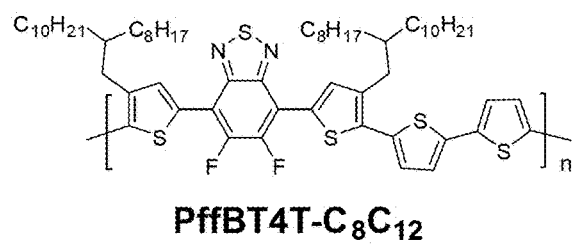
FIG. 5 is the chemical structures of PffBT4T-$C_8C_{12}$ and PffBT4T-$C_{10}C_{14}$.
Figure 5:
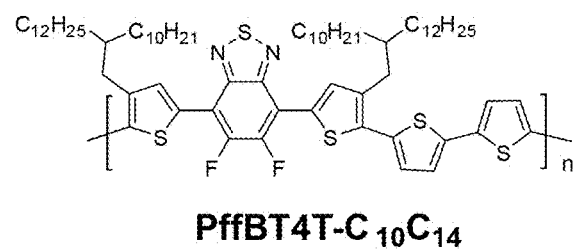
Figure 6A:
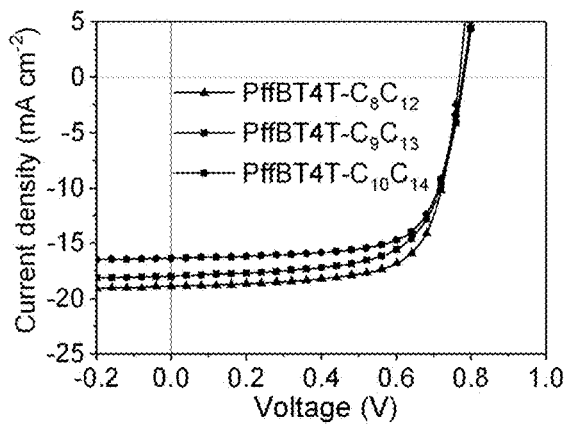
FIG. 6A shows the J-V curves of polymer:$PC_{71}BM$ processed from CB-DIO.
Figure 6B:
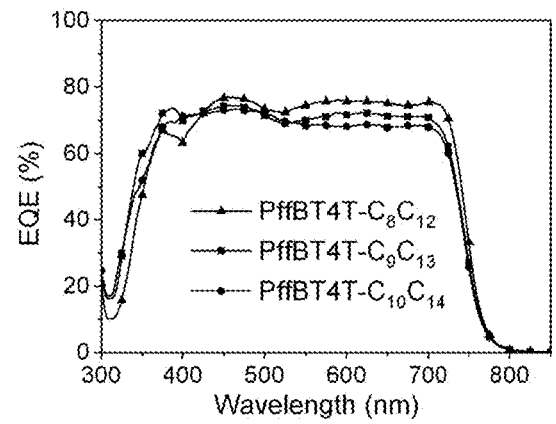
FIG. 6B shows the EQE curves of polymer:$PC_{71}BM$ processed from CB-DIO.
Figure 7A:
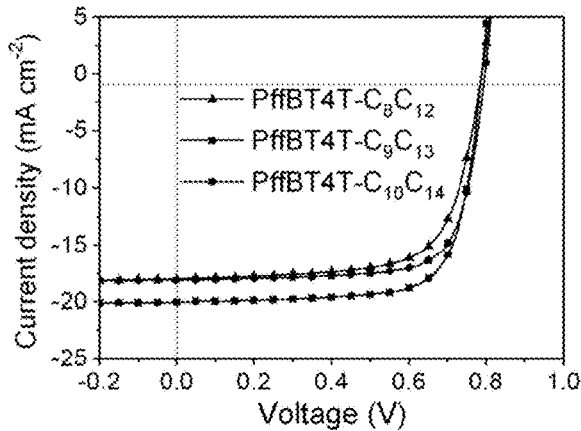
FIG. 7A shows the J-V curves of polymer:$PC_{71}BM$ processed from TMB-PN.
Figure 7B:
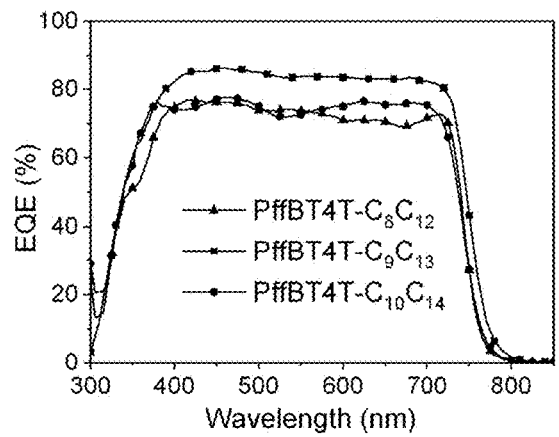
FIG. 7B shows the EQE curves of polymer:$PC_{71}BM$ processed from TMB-PN.
Figure 8:
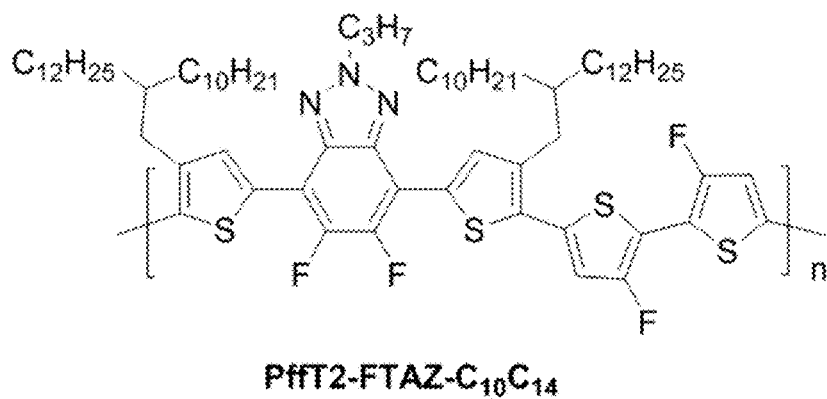
FIG. 8 is the chemical structure of Pfff2-FTAZ-$C_{10}C_{14}$.
Figure 9A:
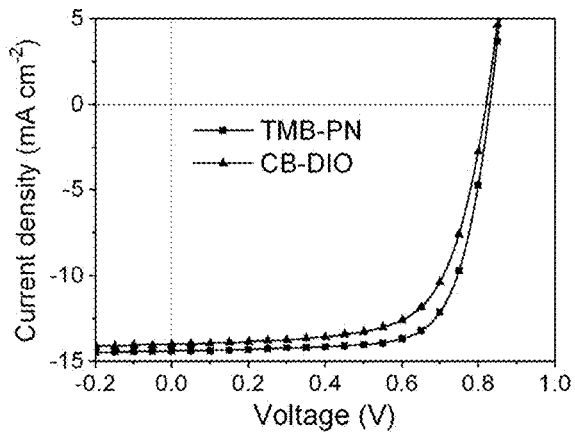
FIG. 9A shows the J-V curves of PffT2-FTAZ-$C_{10}C_{14}$: $PC_{71}BM$ processed from CB-DIO and TMB-PN.
Figure 9B:
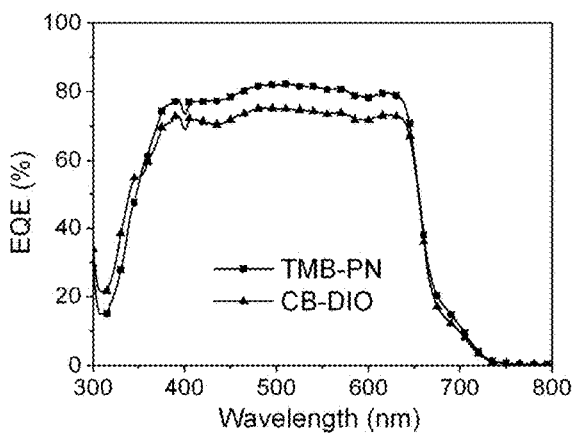
FIG. 9B shows the EQE curves of Pfff2-FTAZ-$C_{10}C_{14}$: $PC_{71}BM$ processed from CB-DIO and TMB-PN.

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, (Pm or Vmp*Jmp), to the theoretical (not actually obtainable) power, (Jsc*Voc). Accordingly, FF can be determined using the equation:

$$FF=(Vmp*Jmp)/(Jsc*Voc)$$

where Jmp and Vmp represent the current density and voltage at the maximum power point (Pm), respectively, this point being obtained by varying the resistance in the circuit until J*V is at its greatest value; and Jsc and Voc represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (Voc) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/m2) under standard test conditions (STC) and the surface area of the solar cell (Ac in m2). STC typically refers to a temperature of 25° C. and an irradiance of 1000 W/m2 with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by General Formula I:

$$*\text{-}(\text{-}(Ma)_x\text{-}(Mb)_y\text{-})_z* \qquad \text{General Formula I}$$

wherein each Ma and Mb is a repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which comonomers Ma and Mb is repeated can be alternating, random, regiorandom, regioregular, or in blocks, with up to z comonomers present. In addition to its composition, a polymeric compound can be further characterized by its degree of polymerization (n) and molar mass (e.g., number average molecular weight (M) and/or weight average molecular weight (Mw) depending on the measuring technique(s)).

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and z'-propyl), butyl (e.g., n-butyl, z'-butyl, sec-butyl, tert-butyl), pentyl groups (e.g., n-pentyl, z'-pentyl, -pentyl), hexyl groups, and the like. In various embodiments, an alkyl group can have 1 to 40 carbon atoms (i.e., C1-40 alkyl group), for example, 1-30 carbon atoms (i.e., C1-30 alkyl group). In some embodiments, an alkyl group can have 1 to 6 carbon atoms, and can be referred to as a "lower alkyl group." Examples of lower alkyl groups include methyl, ethyl, propyl (e.g., n-propyl and z'-propyl), and butyl groups (e.g., n-butyl, z'-butyl, sec-butyl, tert-butyl). In some embodiments, alkyl groups can be substituted as described herein. An alkyl group is generally not substituted with another alkyl group, an alkenyl group, or an alkynyl group.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., C2-40 alkenyl group), for example, 2 to 20 carbon atoms (i.e., C2-20 alkenyl group). In some embodiments, alkenyl groups can be substituted as described herein. An alkenyl group is generally not substituted with another alkenyl group, an alkyl group, or an alkynyl group.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly p-conjugated and optionally substituted as described herein.

As used herein, "heteroatom" refers to an atom of any element other than carbon or hydrogen and includes, for example, nitrogen, oxygen, silicon, sulfur, phosphorus, and selenium.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., C6-24 aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C6F5), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine Noxide thiophene S-oxide, thiophene S,S-dioxide). Examples of heteroaryl groups include, for example, the 5- or 6-membered monocyclic and 5-6 bicyclic ring systems shown below: where T is O, S, NH, N-alkyl, N-aryl, N-(arylalkyl) (e.g., N-benzyl), SiH2, SiH(alkyl), Si(alkyl)2, SiH(arylalkyl), Si(arylalkyl)2, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

In the presently claimed subject matter, one or more of the above aims can be achieved by providing a formulation comprising a family of conjugated polymers containing the following building block:

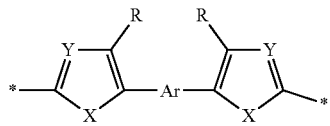

wherein R is a branched alkyl chain with 21 or more carbons and Ar, R, X, Y are as defined herein.

It was surprisingly found that, when such polymers were combined with hydrocarbon solvents and additives, higher power conversion efficiencies can be achieved than those obtained using halogenated solvents. These results are in contrast to previous reports, in which the performance obtained from hydrocarbon solvents was significantly lower than that obtained from halogenated solvents.

It was also surprisingly found that, the polymer side chains need to have 21 or more carbon atoms to achieve the best results. Previously, the best performance was achieved using alkyl chain with 20 carbon atoms and it was shown that alkyl chains with 21 or more carbon atoms have serious negative effects on the device performance.

The most surprising results are that the best results can only be achieved with the combination of two conditions: 1. hydrocarbon solvents are used; 2. The alkyl chains of the polymer have 21 or more carbon atoms. Only satisfying one of the two conditions led to poor results.

In one embodiment in this regard, the conjugated polymer can comprise one or more repeating units of the following formula:

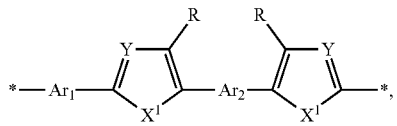

wherein each Y is independently selected from the group consisting of N, C—H, and C—R1, wherein R1 is selected from the group consisting of C1-30 straight-chain and branched alkyl groups;

each $X^1$ is independently selected from the group consisting of S and Se;

each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$═CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group; and each $Ar_1$ and $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and $Ar_2$ may contain one to five of said arylene or heteroarylene each of which may be fused or linked.

In another embodiment, the conjugated polymer is not poly(3-hexylthiophene-2,5-diyl) (P3HT).

In another exemplary embodiment, the present subject matter relates to a formulation comprising an organic solvent, a fullerene, and a conjugated polymer, wherein a solution of the conjugated polymer exhibits a peak optical absorption spectrum red shift of at least 100 nm when the conjugated polymer solution is cooled from 120° C. to room temperature, wherein the fullerene is not phenyl-C71-butyric-acid-methyl-ester (PC71BM), wherein the conjugated polymer comprises one or more repeating units of the following formula:

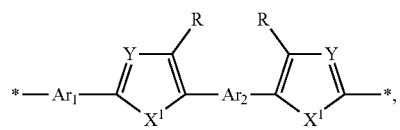

wherein each Y is independently selected from the group consisting of N, C—H, and C—R1, wherein R1 is selected from the group consisting of C1-30 straight-chain and branched alkyl groups;

each $X^1$ is independently selected from the group consisting of S and Se;

each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$═CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;

each $Ar_1$ and $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and $Ar_2$ may contain one to five of said arylene or heteroarylene each of which may be fused or linked; and wherein the conjugated polymer is not poly(3-hexylthiophene-2,5-diyl) (P3HT);

In another exemplary embodiment, the formulation is further characterized in that the fullerene is not phenyl-C61-butyric-acid-methyl-ester (PC61BM).

In some embodiments, the formulation is further characterized in that the conjugated polymer comprises one or more repeating units selected from the group consisting of:

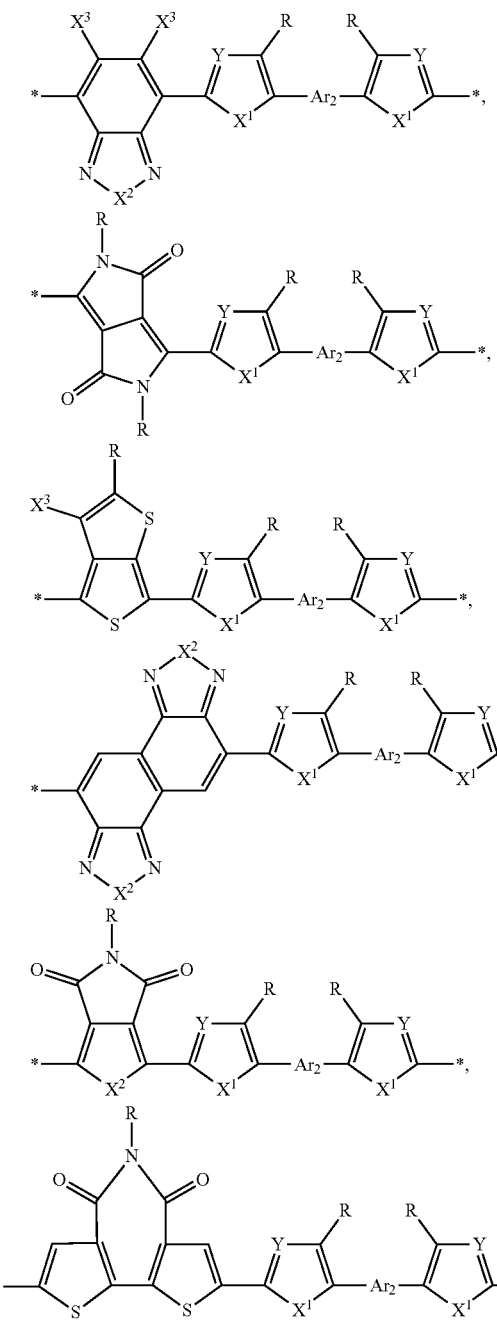

wherein each $X^2$ is independently selected from the group consisting of S, Se, and N—R2, wherein R2 is selected from C1-30 straight-chain or branched alkyl groups;

each $X^3$ is independently selected from the group consisting of F, Cl, H, and Br; and each $Ar_2$ is independently selected from the group consisting of monocyclic, bicyclic, and polycyclic arylene, and monocyclic, bicyclic, and polycyclic heteroarylene, wherein each $Ar_2$ may contain one to five of said arylene or heteroarylene each of which may be fused or linked.

In some embodiments, the formulation is further characterized in that the conjugated polymer comprises one or more repeating units selected from the group consisting of:

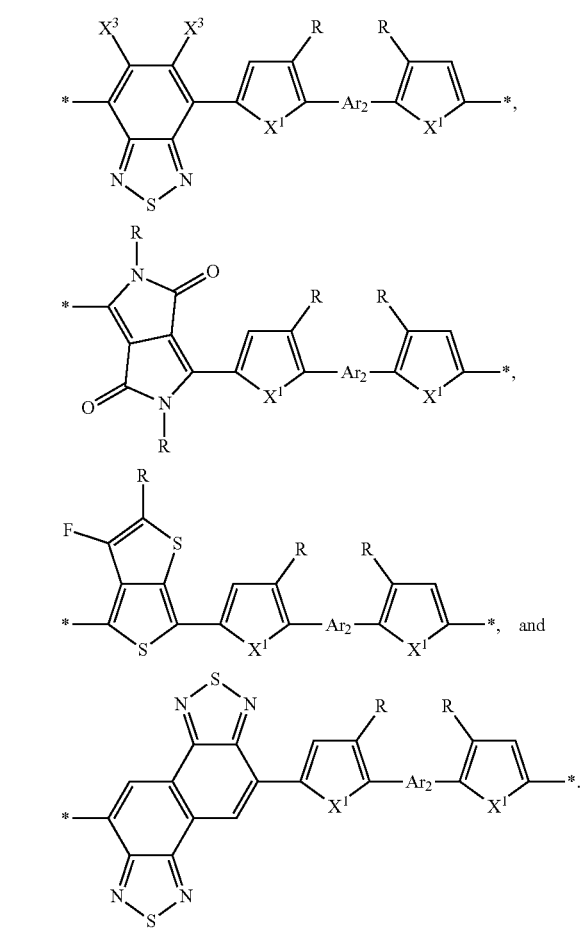

In some embodiments, the formulation is further characterized in that the conjugated polymer comprises one or more repeating units with a formula of:

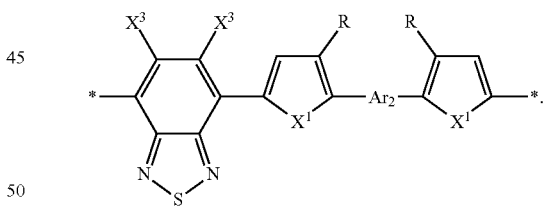

In some embodiments, the formulation is further characterized in that the conjugated polymer comprises one or more repeating units with a formula of:

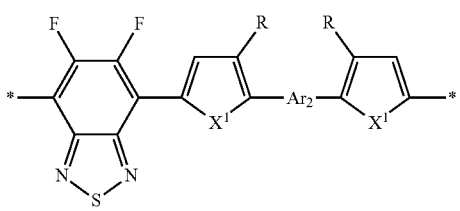

wherein each $X^1$ is independently selected from the group consisting of S and Se;

each R is selected from the group consisting of $C_{17-23}$ branched alkyl groups; and each $Ar_2$ is selected from the group consisting of bithiophene and biselenophene.

In some embodiments, the formulation is further characterized in that the conjugated polymer has an optical bandgap of 1.8 eV or lower, or more preferably, 1.65 eV or lower.

EXAMPLES

Example 1—Synthetic Route to PffBT4T-$C_9C_{13}$

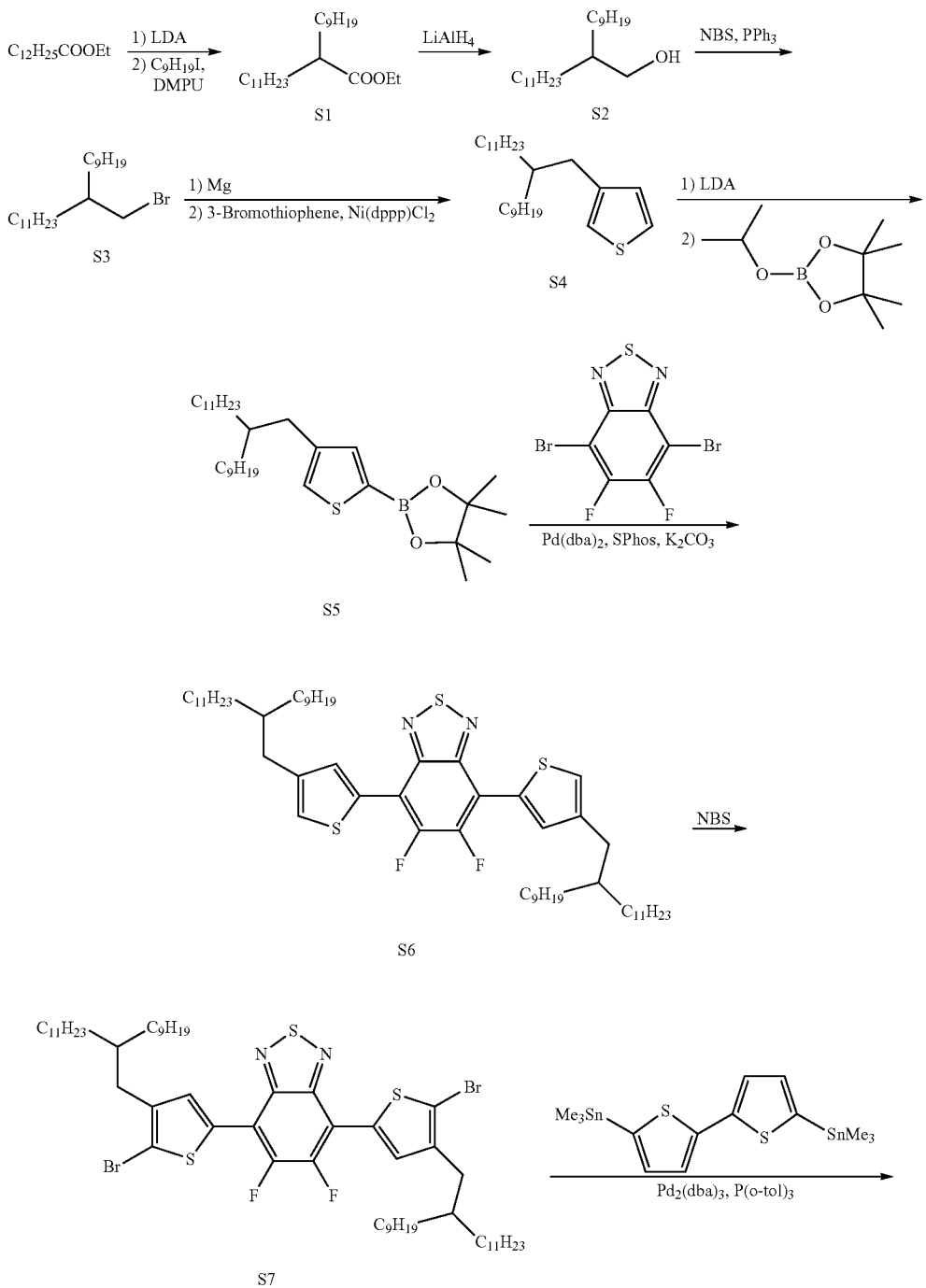

-continued

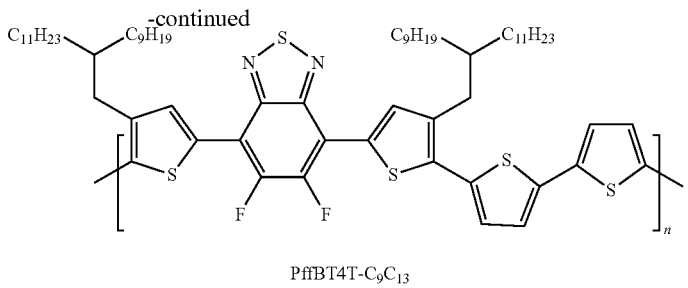

PffBT4T-C$_9$C$_{13}$

With the information contained herein, various departures from precise descriptions of the present subject matter will be readily apparent to those skilled in the art to which the present subject matter pertains, without departing from the spirit and the scope of the below claims. The present subject matter is not considered limited in scope to the procedures, properties, or components defined, since the preferred embodiments and other descriptions are intended only to be illustrative of particular aspects of the presently provided subject matter. Indeed, various modifications of the described modes for carrying out the present subject matter which are obvious to those skilled in chemistry, biochemistry, or related fields are intended to be within the scope of the following claims.

Step 1: Preparation of Ethyl 2-nonyltridecanoate (S1)

A lithium diisopropylamide solution (2 M, 4.5 mL, 8.9 mmol) was diluted with tetrahydrofuran (15 mL) under nitrogen atmosphere. The solution was cooled to −78° C. and ethyl tridecanoate (Alfa Aesar B25242, 1.8 mL, 7.4 mmol) was added dropwise. The reaction mixture was stirred at the same temperature for 1 h before 1,3-dimethyl-3,4,5,6-tetrahydro-2(1H)-pyrimidinone (0.27 mL, 2.2 mmol) was added in one portion. 1-Iodononane (TCI 10493, 2.72 g, 9.67 mmol) was added dropwise. The mixture was warmed to −40° C. and stirred for 2 h before returned to r.t. overnight. A saturated ammonium chloride aqueous solution was added and the mixture was extracted with diethyl ether for three times. The combined organic extracts were washed with hydrochloric acid (IM aqueous solution) for three times, dried over sodium sulfate, and concentrated in vacuum. The residue was purified by flash column chromatography on silica gel (eluent: n-hexane:dichloromethane=6:1, stained with phosphomolybdic acid) to get the product as colorless oil (2.2 g, 80%). $^1$H NMR (400 MHz, CDCl$_3$) δ 4.13 (q, J=7.2 Hz, 2H), 2.35-2.25 (m, 1H), 1.62-1.19 (m, 39H), 0.88 (t, J=6.4 Hz, 6H). $^{13}$C NMR (100 MHz, CDCl$_3$) δ 176.79, 60.05, 45.92, 32.67, 32.07, 32.04, 29.78, 29.73, 29.70, 29.63, 29.50, 29.45, 27.58, 22.83, 14.50, 14.25. HRMS (CI+) Calcd for C$_{24}$H$_{49}$O$_2$(M+H$^+$): 369.3733, Found: 369.3727.

Step 2: Preparation of 2-Nonyltridecanol (S2)

A solution of compound S1 (310 mg, 0.842 mmol) in tetrahydrofuran (3 mL) was cooled to 0° C. under nitrogen atmosphere, and a lithium aluminium hydride solution (0.70 mL, 1.7 mmol) was added dropwise. The reaction mixture was warmed to r.t. and refluxed overnight. The reaction mixture was then cooled to 0° C. and quenched with water. Hydrochloric acid (37%) was then added until the solution became clear. The mixture was extracted with diethyl ether for three times. The organic extracts were combined, washed with water followed by brine. Then the solution was dried over sodium sulfate and concentrated in vacuum to get the product as colorless oil (272 mg, 99%). $^1$H NMR (400 MHz, CDCl$_3$) δ 3.53 (d, J=5.6 Hz, 2H), 1.51-1.19 (m, 38H), 0.88 (t, J=6.8 Hz, 6H). $^{13}$C NMR (100 MHz, CDCl$_3$) δ 65.89, 40.69, 32.07, 31.08, 30.22, 29.83, 29.81, 29.51, 27.04, 22.84, 14.25. HRMS (CI−) Calcd for C$_{22}$H$_{45}$O (M−H$^-$): 325.3470, Found: 325.3486.

Step 3: Preparation of 2-Nonyltridecyl Bromide (S3)

A solution of compound S2 (427 mg, 1.31 mmol) and triphenylphosphine (377 mg, 1.44 mmol) in dichloromethane (10 mL) was cooled to 0° C., and N-bromosuccinimide (256 mg, 1.44 mmol) was added in portions. The reaction mixture was warmed to r.t. and stirred overnight. The reaction mixture was concentrated in vacuum and suspended in hexane. The mixture was filtered and washed with hexane. The filtrate was concentrated in vacuum and the residue was purified by flash column chromatography (eluent: n-hexane, stained with phosphomolybdic acid) to get the product as colorless oil (478 mg, 94%). $^1$H NMR (400 MHz, CDCl$_3$) δ 3.45 (d, J=4.8 Hz, 2H), 1.65-1.55 (m, 1H), 1.45-1.20 (m, 36H), 0.88 (t, J=6.4 Hz, 6H). 13C NMR (100 MHz, CDCl$_3$) δ 39.91, 39.64, 32.70, 32.08, 29.94, 29.83, 29.79, 29.75, 29.51, 29.49, 26.71, 22.85, 14.28. HRMS (CI+) Calcd for C$_{22}$H$_{45}$ (M−Br$^+$): 309.3521, Found: 309.3522.

Step 4: Preparation of 3-(2-Nonyltridecyl)thiophene (S4)

In an oven-dried three-neck flask equipped with a condenser and a dropping funnel, a suspension of magnesium (323 mg, 13.3 mmol) and a drop of 1,2-dibromoethane in tetrahydrofuran (15 mL) was stirred and heated to reflux under nitrogen atmosphere. Compound S3 (4.3 g, 11 mmol) was dissolved in tetrahydrofuran (10 mL) and added dropwise via the funnel. The mixture was refluxed overnight, diluted with tetrahydrofuran (20 mL) and cooled to room temperature. The solution was transferred via syringe to another oven-dried flask, where there is a mixture of 3-bromothiophene (2.2 g, 13 mmol) and Ni(dppp)Cl$_2$ (150 mg, 0.277 mmol) in tetrahydrofuran (20 mL) cooled with an ice/water bath. The mixture was stirred and return to r.t. overnight before quenched with hydrochloric acid (IM). The mixture was then extracted with diethyl ether for three times. The combined extracts was washed with water and then brine, dried over sodium sulfate and concentrated under reduced pressure. The crude product was purified by repeated flash column chromatography (eluent: n-hexane) to get the product as colorless oil (690 mg, 16%). $^1$H NMR (400 MHz, CDCl$_3$) δ 7.22 (dd, J=4.8, 3.2 Hz, 1H), 6.90-6.85 (m, 2H), 2.55 (d, 2H, J=6.8 Hz), 1.65-1.55 (m, 1H), 1.45-1.15 (m, 36H), 0.88 (t, J=6.4 Hz, 6H). $^{13}$C NMR (100 MHz, CDCl$_3$) δ 142.07, 128.96, 124.90, 120.77, 39.08, 34.85, 33.47, 32.08, 30.16, 29.83, 29.79, 29.52, 26.77, 22.85, 14.28. HRMS (CI+) Calcd for C$_{26}$H$_{49}$S (M+H$^+$): 393.3555, Found: 393.3546.

Step 5: Preparation of
3-(2-Nonyltridecyl)thiophene-2-boronic Acid
Pinacol Ester (S5)

A solution of compound S4 (1.17 g, 2.99 mmol) in tetrahydrofuran (10 mL) was cooled to −78° C. under nitrogen atmosphere, and a lithium diisopropylamide solution (2 M, 1.8 mL, 3.6 mmol) was added dropwise. The reaction mixture was warmed to 0° C. and stirred for 1 h before cooled again to −78° C. 2-Isopropoxy-4,4,5,5-tetramethyl-1,3,2-dioxaborolane (0.91 mL, 4.48 mmol) was added in one portion. The reaction mixture was warmed to r.t. and stirred overnight before quenched with a saturated ammonium chloride aqueous solution. The mixture was extracted with diethyl ether for three times. The organic extracts were combined, washed with water and then brine, dried over sodium sulfate, and concentrated in vacuum. The residue was purified by flash column chromatography (eluent: n-hexane:dichloromethane=10:1) to get the product as pale yellow oil (1.42 g, 92%). $^1$H NMR (400 MHz, CDCl$_3$) δ 7.43 (d, J=1.2 Hz, 1H), 7.17 (d, J=0.8 Hz, 1H), 2.54 (d, J=6.8 Hz, 2H), 1.66-1.55 (m, 1H), 1.34 (s, 12H), 1.50-1.15 (m, 36H), 0.88 (t, J=6.8 Hz, 6H). $^{13}$C NMR (100 MHz, CDCl$_3$) δ 143.63, 139.16, 128.52, 84.11, 39.15, 34.63, 33.43, 32.07, 30.14, 29.83, 29.78, 29.50, 26.75, 24.91, 22.84, 14.27. HRMS (CI+) Calcd for C$_{32}$H$_{59}$BO$_2$S (M$^+$): 518.4329, Found: 518.4322.

Step 6: Preparation of 5,6-Difluoro-4,7-bis(4-(2-nonyltridecyl)-2-thienyl)-2,1,3-benzothiadiazole
(S6)

Compound S5 (327 mg, 0.630 mmol), 4,7-dibromo-5,6-difluoro-2,1,3-benzothiadiazole (Derthon BT112, 94.5 mg, 0.286 mmol), potassium carbonate (396 mg, 2.86 mmol), Pd(dba)$_2$ (16.5 mg, 0.0286 mmol) and 2-dicyclohexylphosphino-2',6'-dimethoxybiphenyl (11.8 mg, 0.0286 mmol) were mixed under nitrogen atmosphere. Toluene (6 mL) and water (2 mL) were added. The mixture was refluxed overnight before cooled to r.t. The mixture was diluted with diethyl ether and water. The organic layer was separated and washed with a saturated ammonium chloride aqueous solution, dried over sodium sulfate, and concentrated in vacuum. The residue was purified by flash column chromatography (eluent: n-hexane) to get the product as yellow solid (233 mg, 85%). $^1$H NMR (400 MHz, CDCl$_3$) δ 8.09 (s, 2H), 7.17 (s, 2H), 2.65 (d, J=6.8 Hz, 4H) 1.80-1.62 (m, 2H), 1.45-1.15 (m, 72H), 0.87 (t, J=6.4 Hz, 12H). $^{13}$C NMR (100 MHz, CDCl$_3$) δ 149.91 (dd, J=261, 20.6 Hz), 149.09 (t, J=4.1 Hz), 142.52, 133.00, 132.98 (d, J=3.7 Hz), 131.15, 124.99, 111.84 (dd, J=9.1, 4.1 Hz), 39.11, 35.02, 33.49, 32.08, 30.18, 29.86, 29.82, 29.53, 26.80, 22.85, 14.27. $^{19}$F NMR (376 MHz, CDCl$_3$) δ −128.20 (s, 2F). HRMS (MALDI+) Calcd for C$_{58}$H$_{94}$F$_2$N$_2$S$_3$(M$^+$): 952.6547, Found: 952.6525.

Step 7: Preparation of
3-(2-Nonyltridecyl)thiophene-2-boronic Acid
Pinacol Ester (S7)

A suspension of compound S6 (3.07 g, 3.22 mmol) and a small amount of silica gel in chloroform (50 mL) was cooled to 0° C. in dark. N-bromosuccinimide (1.26 g, 7.07 mmol) was added in one portion. The reaction mixture was warmed to r.t., stirred overnight and concentrated in vacuum. The residue was purified by flash column chromatography (eluent: n-hexane) to get the product as orange solid (3.34 g, 93%). $^1$H NMR (400 MHz, CDCl$_3$) δ 7.91 (s, 2H), 2.58 (d, J=7.2 Hz, 4H) 1.82-1.68 (m, 2H), 1.45-1.15 (m, 72H), 0.92-0.80 (m, 12H). $^{13}$C NMR (100 MHz, CDCl$_3$) δ 149.81 (dd, J=261, 20.4 Hz), 148.57 (t, J=4.3 Hz), 141.93, 132.51 (t, J=4.5 Hz), 131.17, 115.25 (t, J=3.4 Hz), 111.16 (dd, J=9.0, 4.0 Hz), 38.68, 34.28, 33.52, 32.08, 30.17, 29.87, 29.82, 29.53, 26.70, 22.85, 14.27. $^{19}$F NMR (376 MHz, CDCl$_3$) δ −128.02 (s, 2F). HRMS (MALDI+) Calcd for C$_{58}$H$_{92}$Br$_2$F$_2$N$_2$S$_3$ (M$^+$): 1108.4757, Found: 1108.4775.

Step 8: Preparation of PffBT4T-C$_9$C$_{13}$

A mixture of monomer S7 (104 mg, 0.0939 mmol), 5,5'-bis(trimethylstannyl)-2,2'-bithiophene (Sunatech IN1207, 46.2 mg, 0.0939 mmol), Pd$_2$(dba)$_3$ (1 mg, 0.001 mmol) and P(o-tol)$_3$ (2 mg, 0.007 mmol) was placed in a microwave tube. Toluene (0.4 mL) was added in a glove box which is filled with nitrogen. The tube was sealed and heated to 140° C. for 1 h in a microwave reactor. The obtained deep green gel was diluted with 20 mL hot xylene and the deep red solution was precipitated into methanol. The solid was collected by filtration, and loaded into a thimble in a Soxhlet extractor. The crude polymer was extracted successively with acetone, dichloromethane and chloroform. The chloroform solution was concentrated by evaporation, re-dissolved in hot toluene and precipitated into methanol. The solid was collected by filtration and dried in vacuo to get the polymer as deep green solid (77 mg, 74%). $^1$H NMR (400 MHz, C$_2$D$_2$C$_{14}$, 393 K). δ 8.21 (s, 2H), 7.27 (br, 4H), 2.94 (d, J=6.4 Hz, 4H), 1.98-1.86 (m, 2H), 1.58-1.12 (m, 72H), 1.02-0.84 (m, 12H). Elem. Anal. Calcd for C$_{66}$H$_{96}$F$_2$N$_2$S$_5$: C, 71.05; H, 8.67; N, 2.51. Found: C, 71.24; H, 8.79; N, 2.40. HT-GPC: M$_n$=68.4 kDa, M$_w$=111 kDa, PDI=1.62.

Example 2—Solar Cell Fabrication and Testing

Pre-patterned ITO-coated glass with a sheet resistance of ~15Ω per square was used as the substrate. It was cleaned by sequential ultrasonication in soap deionized water, deionized water, acetone and isopropanol for 15 min at each step. The washed substrates were further treated with a UV-O$_3$ cleaner (Novascan, PSD Series digital UV ozone system) for 30 min. A topcoat layer of ZnO (A diethylzinc solution, 15 wt % in toluene, diluted with tetrahydrofuran) was spin-coated onto the ITO substrate at a spinning rate of 5000 rpm for 30 s and then baked in air at 150° C. for 20 min. Active layer solutions (polymer:fullerene weight ratio 1:1.2) were prepared in TMB or CB with or without 2.5% of PN or DIO. The polymer concentration is 6 mg ml$^{-1}$ for PffBT4T-C$_8$C$_{12}$, 10 mg ml$^{-1}$ for PffBT4T-C$_9$C$_{13}$, 18 mg ml$^{-1}$ for PffBT4T-C$_{10}$C$_{14}$ and 10 mg ml$^{-1}$ for Pfff2-FTAZ-C$_{10}$C$_{14}$. To completely dissolve the polymer, the active layer solution should be stirred on a hot plate at 100° C. for at least 1 h. Before spin coating, both the polymer solution and ITO substrate are preheated on a hot plate at 100° C. Active layers were spin coated from the warm polymer solution on the preheated substrate in a N$_2$ glovebox at 600 r.p.m. The optimal PffBT4T-C$_9$C$_{13}$:PC$_{71}$BM film thickness is 350-400 nm. The active layers were then treated with vacuum to remove the high boiling point additives. The blend films were annealed at 80° C. for 5 min before being transferred to the vacuum chamber of a thermal evaporator inside the same glovebox.

At a vacuum level of 3×10$^{-6}$ Torr, a thin layer (20 nm) of V$_2$O$_5$ was deposited as the anode interlayer, followed by deposition of 100 nm of Al as the top electrode. All cells were encapsulated using epoxy inside the glovebox. Device J-V characteristics was measured under AM1.5G (100 mW cm$^2$) using a Newport Class A solar simulator (94021A, a Xenon lamp with an AM1.5G filter) in air at room temperature. A standard Si diode with KG5 filter was purchased from PV Measurements and calibrated by Newport Corporation. The light intensity was calibrated using the Si diode as a reference cell to bring spectral mismatch to unity. J-V characteristics were recorded using a Keithley 2400 source meter unit. Typical cells have devices area of 5.9 mm$^2$, which is defined by a metal mask with an aperture aligned with the device area. EQEs were characterized using a Newport EQE system equipped with a standard Si diode. Monochromatic light was generated from a Newport 300 W lamp source.

Example 3—AFM Analysis

AFM measurements were performed by using a Scanning Probe Microscope-Dimension 3100 in tapping mode. All film samples were spin-cast on ITO/ZnO substrates.

Example 4—Optical Characterizations

Solution UV-Vis absorption spectra at elevated temperatures were collected on a Perkin Elmer Lambda 950 UV/VIS/NIR Spectrophotometer. The temperature of the cuvette was controlled with a Perkin Elmer PTP 6+6 Peltier System, which is supplied by a Perkin Elmer PCB 1500 Water Peltier System. Before each measurement, the system was held for at least 10 min at the target temperature to reach thermal equilibrium. A cuvette with a stopper (Sigma Z600628) was used to avoid volatilization during the measurement.

In first embodiment of the present invention, a formulation is disclosed. The formulation comprises a single or mixture of non-halogenated, hydrocarbon solvent, a conjugated polymer donor and a fullerene or small molecular acceptor, wherein the conjugated polymer contains branched alkyl chains with 21 or more carbon atoms.

In second embodiment of the present invention, an organic semiconductor formulation is disclosed. The organic semiconductor formulation comprises:
 a single or mixture of hydrocarbon solvent;
 a fullerene or small molecular acceptor; and
 a conjugated polymer donor, comprises one or more repeating units of the following formula:

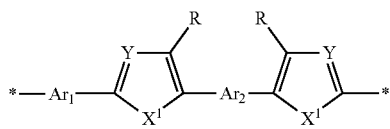

wherein
 each Y is independently selected from the group consisting of N, C—H, and C—R1, wherein R1 is selected from the group consisting of C1-30 straight-chain and branched alkyl groups;
 each X$^1$ is independently selected from the group consisting of S and Se;
 each R is independently selected from the group consisting of straight-chain, branched, and cyclic alkyl with 21-40 C atoms, wherein one or more non-adjacent C atoms are optionally replaced by —O—, —S—, —C(O)—, —C(O)—O—, —O—C(O)—, —O—C(O)—O—, —CR$^0$=CR$^{00}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^0$ and R$^{00}$ are independently a straight-chain, branched, or cyclic alkyl group;
 each Ar$_1$ and Ar$_2$ is independently selected from the group consisting of unsubstituted or substituted monocyclic, bicyclic, and polycyclic arylene, and monocyclic, bicyclic, and polycyclic heteroarylene, wherein each Ar$_1$ and Ar$_2$ may contain one to five of said arylene or heteroarylene each of which may be fused or linked; and
 wherein the conjugated polymer is not poly(3-hexylthiophene-2,5-diyl) (P3HT). The conjugated polymer has an optical bandgap of 1.8 eV or lower, or more preferably, 1.65 eV or lower.

An organic electronic (OE) device comprising an organic semiconductor layer, which is formed from the organic semiconductor formulation. The organic electronic (OE) device comprises organic field effect transistor (OFET) device and organic solar cell (OSC) device.

In third embodiment of the present invention, an organic semiconductor formulation is disclosed. The organic semiconductor formulation comprises:
 a hydrocarbon solvent;
 an aromatic additive, is from 0.01 wt % to 10 wt % of the hydrocarbon solvent;
 a fullerene or small molecular acceptor; and
 a conjugated polymer donor, comprises one or more repeating units of the following formula:

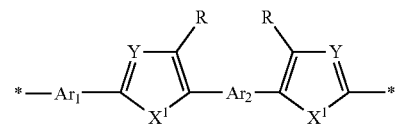

wherein
 each Y is independently selected from the group consisting of N, C—H, and C—R1, wherein R1 is selected from the group consisting of C1-30 straight-chain and branched alkyl groups;
 each X$^1$ is independently selected from the group consisting of S and Se;
 each R is independently selected from the group consisting of straight-chain, branched, and cyclic alkyl with 21-40 C atoms, wherein one or more non-adjacent C atoms are optionally replaced by —O—, —S—, —C(O)—, —C(O)—O—, —O—C(O)—, —O—C(O)—O—, —CR$^0$=CR$^{00}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^0$ and R$^{00}$ are independently a straight-chain, branched, or cyclic alkyl group;
 each Ar$_1$ and Ar$_2$ is independently selected from the group consisting of unsubstituted or substituted monocyclic, bicyclic, and polycyclic arylene, and monocyclic, bicyclic, and polycyclic heteroarylene, wherein each Ar$_1$ and Ar$_2$ may contain one to five of said arylene or heteroarylene each of which may be fused or linked; and wherein the conjugated polymer is not poly(3-hexylthiophene-2,5-diyl) (P3HT). The conjugated polymer has an optical bandgap of 1.8 eV or lower, or more preferably, 1.65 eV or lower.

In some embodiments, the hydrocarbon solvent is aromatic hydrocarbon solvent, and more preferred, is 1,2,4-trimethylbenzene (TMB).

In some embodiments, the aromatic additive is fused-ring based structure, and more preferred, is 1-phenylnaphethlene (PN).

In some embodiments, the conjugated polymer comprises one or more repeating units selected from the group consisting of:

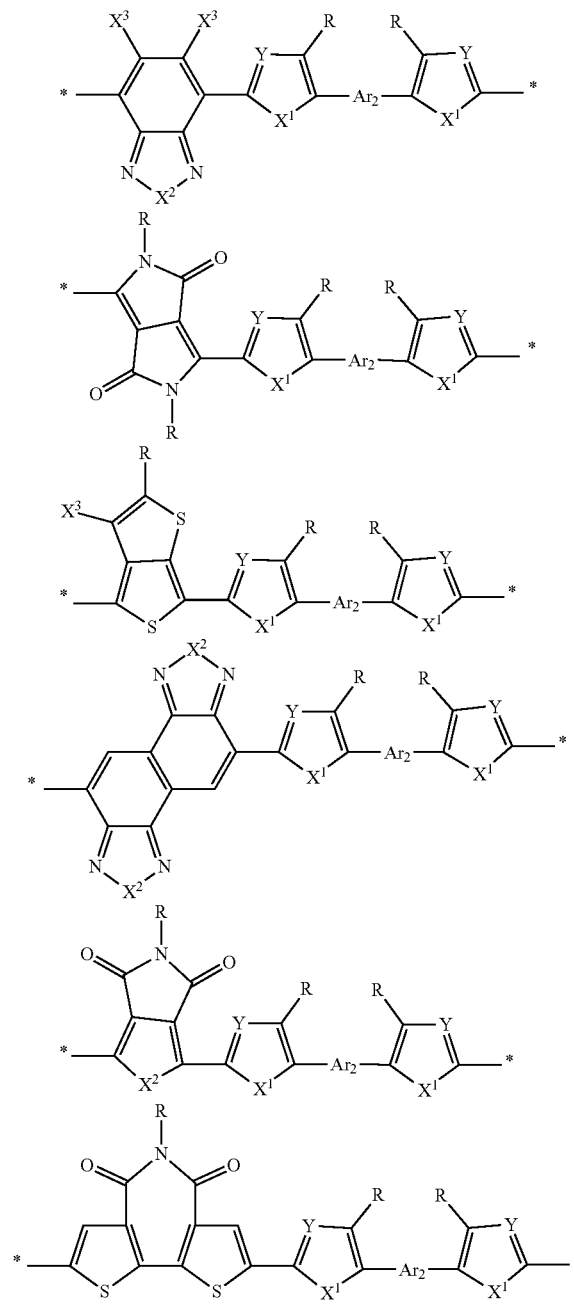

wherein each $X^2$ is independently selected from the group consisting of S, Se, O, and N—R2, wherein R2 is selected from C1-30 straight-chain or branched alkyl groups;

each $X^3$ is independently selected from the group consisting of F, Cl, H, and Br; and each $Ar_2$ is independently selected from the group consisting of monocyclic, bicyclic, and polycyclic arylene, and monocyclic, bicyclic, and polycyclic heteroarylene, wherein each $Ar_2$ may contain one to five of said arylene or heteroarylene each of which may be fused or linked.

In some embodiments, the conjugated polymer comprises one or more repeating units selected from the group consisting of:

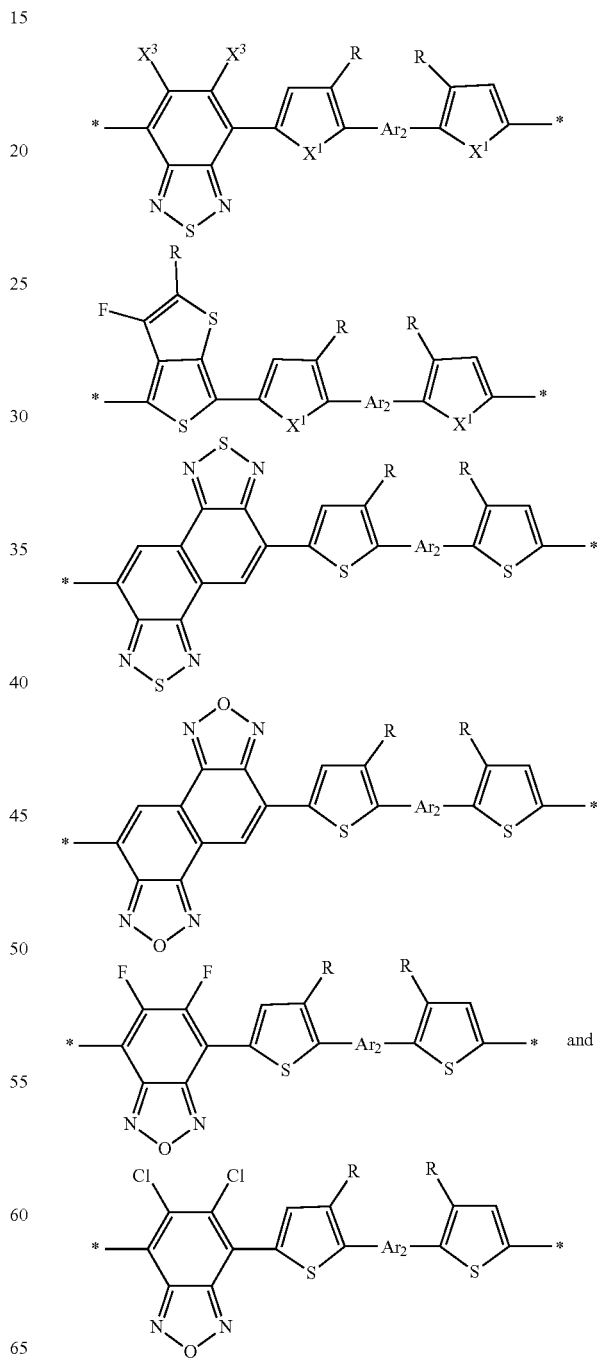

each $X^1$ is independently selected from the group consisting of S and Se;
each $X^3$ is independently selected from the group consisting of $C_1$ and F;
each R is independently selected from the group consisting of $C_{21-25}$ branched alkyl groups; and
each $Ar_2$ is selected from the group consisting of substituted or unsubstituted bithiophene.

In some embodiments, the conjugated polymer comprises one or more repeating units selected from the group consisting of:

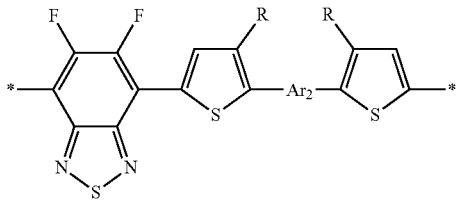

wherein
each R is independently selected from the group consisting of $C_{21-25}$ branched alkyl groups; and
each $Ar_2$ is selected from the group consisting of substituted or unsubstituted bithiophene.

An organic electronic (OE) device comprising an organic semiconductor layer, which is formed from the organic semiconductor formulation. The organic electronic (OE) device comprises organic field effect transistor (OFET) device and organic solar cell (OSC) device.

In fourth embodiment of the present invention, an organic semiconductor film forming method is disclosed. The method comprises the steps of:
Coating the organic semiconductor formulation of the second or third embodiment onto a substrate; and
Drying the organic semiconductor formulation of the second or third embodiment coated on the substrate.

In some embodiments, temperature of the substrate in the coating step is equal to or more than 80 degrees Celsius, and more preferred, equal to or more than 90 degrees Celsius.

In some embodiments, temperature of the organic semiconductor formulation in the coating step is equal to or more than 80 degrees Celsius, and more preferred, equal to or more than 90 degrees Celsius.

In some embodiments, temperature of the organic semiconductor formulation coated on the substrate in the drying step is equal to or more than 80 degrees Celsius.

What is claimed is:
1. An organic semiconductor formulation comprising:
a single or mixture of hydrocarbon solvent;
a fullerene or small molecular acceptor; and
a conjugated polymer donor, formed by a conjugated polymer which comprises one or more repeating units of the following formula:

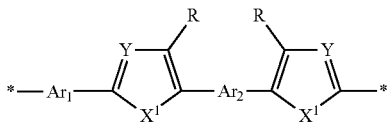

wherein
each Y is independently selected from the group consisting of N, C—H, and C—R1, wherein R1 is selected from the group consisting of C1-30 straight-chain and branched alkyl groups;
each $X^1$ is independently selected from the group consisting of S and Se;
each R is independently selected from the group consisting of straight-chain, branched, and cyclic alkyl with 21-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^o$ and R$^{oo}$ are independently a straight-chain, branched, or cyclic alkyl group;
$Ar_1$ is selected from the group consisting of:

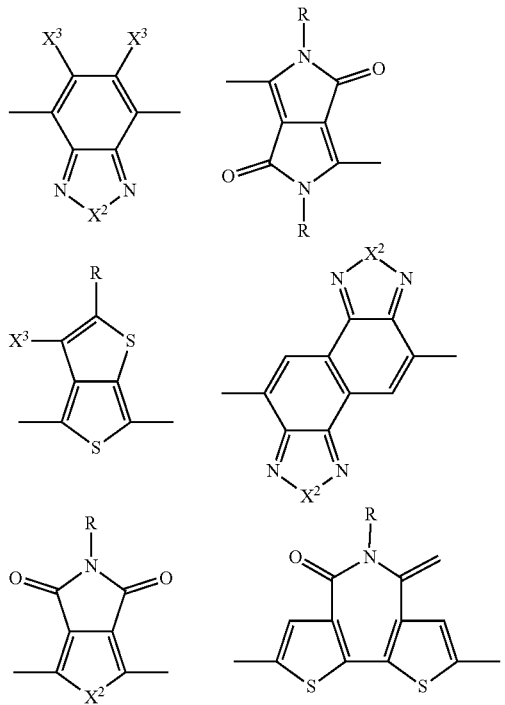

each $X^2$ is independently selected from the group consisting of S, Se, O, and N—R2, wherein R2 is selected from C1-30 straight-chain or branched alkyl groups;
each $X^3$ is independently selected from the group consisting of F, Cl, H, and Br;
$Ar_2$ is selected from the group consisting of unsubstituted or substituted monocyclic, bicyclic, and polycyclic arylene, and monocyclic, bicyclic, and polycyclic heteroarylene, wherein $Ar_2$ may contain one to five of said arylene or heteroarylene each of which may be fused or linked; and
wherein the conjugated polymer is not poly(3-hexylthiophene-2,5-diyl) (P3HT).
2. The organic semiconductor formulation of claim 1, wherein the conjugated polymer has an optical bandgap of 1.8 eV or lower.

3. The organic semiconductor formulation of claim 1, wherein the conjugated polymer has an optical bandgap of 1.65 eV or lower.

\* \* \* \* \*